United States Patent [19]

Lin

[11] Patent Number: 5,266,817
[45] Date of Patent: Nov. 30, 1993

[54] PACKAGE STRUCTURE OF MULTI-CHIP LIGHT EMITTING DIODE

[76] Inventor: Paul Y. S. Lin, 12th Fl., No. 25, Sec. 1, Tunghua S. Rd., Taipei, Taiwan

[21] Appl. No.: 884,195

[22] Filed: May 18, 1992

[51] Int. Cl.$^5$ ............................................. H01L 33/00
[52] U.S. Cl. ...................................... 257/89; 257/98; 257/99
[58] Field of Search ................. 257/100, 89, 98, 99, 257/676, 88; 313/500, 512; 362/800

[56] References Cited

U.S. PATENT DOCUMENTS 4,878,107  10/1989  Hopper ................................. 257/99

FOREIGN PATENT DOCUMENTS

| | | | |
|---|---|---|---|
| 59-197178 | 11/1984 | Japan | 257/99 |
| 61-296778 | 12/1986 | Japan | 257/89 |
| 2-5579 | 1/1990 | Japan | 257/98 |
| 2-238679 | 9/1990 | Japan | 257/89 |
| 2-238680 | 9/1990 | Japan | 257/89 |
| 3-55888 | 3/1991 | Japan | 257/88 |

*Primary Examiner*—William Mintel
*Assistant Examiner*—Minhloan Tran
*Attorney, Agent, or Firm*—Michael D. Bednarek

[57] ABSTRACT

A light emitting diode includes a base with a recess and a housing mounted above the base. A conductive plate is mounted in the recess with a red chip, a green chip, and two blue chips disposed thereon, all of which being enclosed by the housing. A first pin has a first contact electrically connected to the red chip and a second contact extending downward and out of the base. A second pin has a first contact electrically connected to the green chip and a second contact extending downward and out of the base. A third pin has a first contact electrically connected to the blue chips and a second contact extending downward and out of the base. A common cathode pin has a first contact electrically connected to the conductive plate and a second contact extending downward and out of the base. Different intensities of light of the three primary colors emitted by the chips result in any desired colored light. A bottom surface and a peripheral wall of the recess are covered by a scattering agent, providing a complete mixing of light emitted by the chips.

2 Claims, 3 Drawing Sheets

PACKAGE STRUCTURE OF MULTI-CHIP LIGHT EMITTING DIODE

BACKGROUND OF THE INVENTION

The present invention relates to a light emitting diode (LED) and, more particularly, to an improved LED capable of emitting lights of various colors.

LEDs are widely used in many fields due to low energy consumption and durable life. Limited by technical problems, early LEDs were merely able to generate monochromatic light. Current LEDs are able to generate two colors. Yet the three primary colors (i.e., blue, green, and red) of light are required for generating lights of different colors.

Therefore, there has been a long and unfulfilled need for an LED which generates lights of various colors to improve and increase the application of LEDs.

SUMMARY OF THE INVENTION

It is an object of the present invention to provide an LED which outputs a mixed light of any desired color. This is achieved by providing a red chip, a green chip, and two blue chips. Different intensities of the primary-colored lights emitted by the chips result in any desired colored light.

According to the preferred embodiment of the present invention, the primary color lights are mixed in a reflective recess of a base of the LED to form a desired color light, which is then emitted through the housing of the LED. Preferably, the peripheral wall and the bottom surface of the reflective recess is coated with a layer of scattering agent to provide a effective mixing of light. Four pins are provided with each angularly and equidistantly disposed on the base at one end thereof to respectively connect the four chips and with the other end thereof penetrating downward through the base. By such an arrangement, without increasing the volume of the LED, the number of pins and chips are increased to control the color of light to be emitted.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
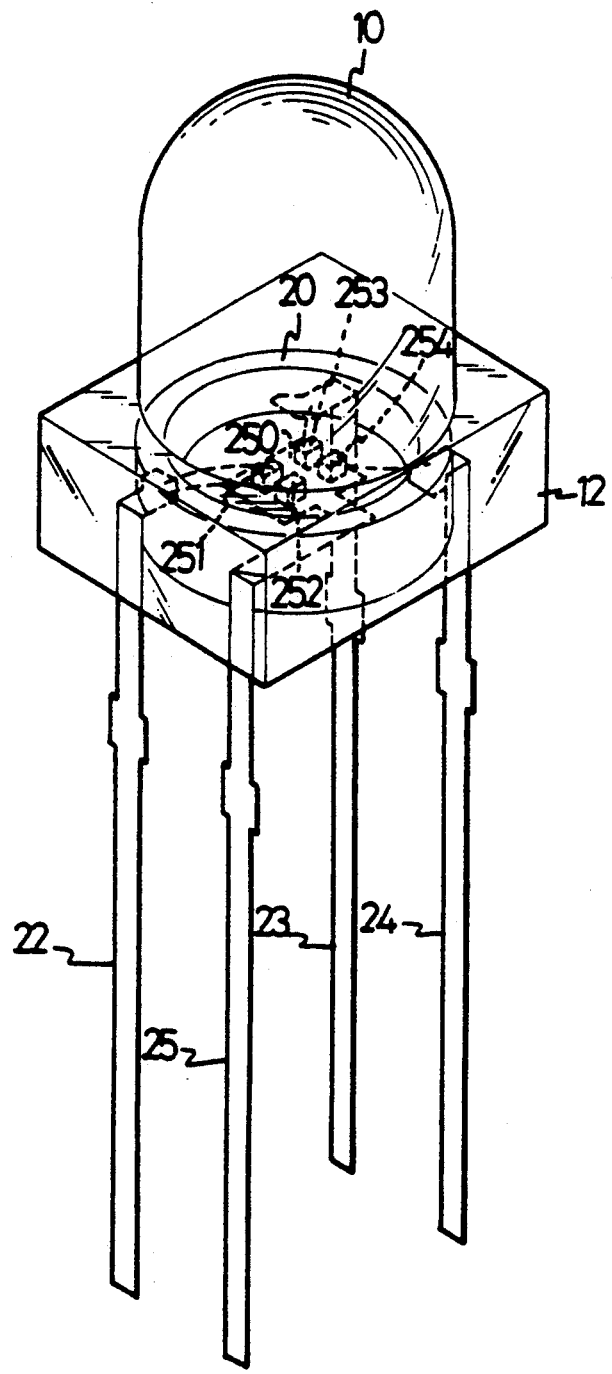
FIG. 1 is a perspective view of a light emitting diode in accordance with the present invention.
Figure 2:
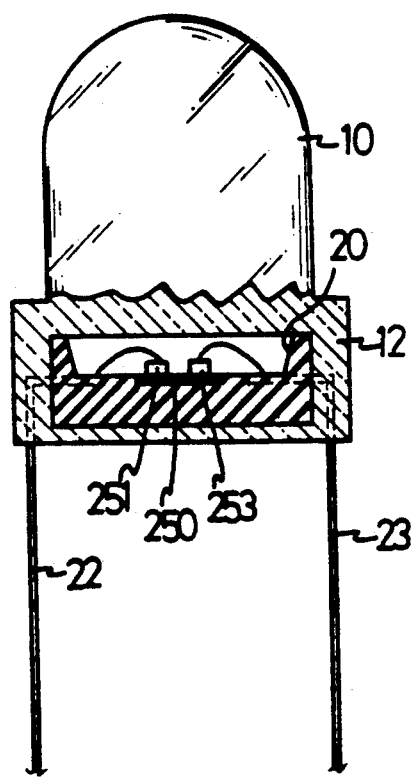
FIG. 2 is a side elevational view, partly in section, of the LED.

Referring to FIGS. 1 and 2, a light emitting diode in accordance with the present invention generally includes a base 12 having a recess 20 formed thereon, a housing 10 disposed above the base 12, and four pins 22, 23, 24, and 25. A conductive plate 250 is mounted in the recess 20 with a red chip 253, a green chip 254, and two blue chips 251, 252 thereon (since the brightness of the blue light emitted by the a blue chip is merely of ⅓ to ½ of that emitted by the red chip or green chip), which are all enclosed by the housing 10. The base 12 is preferably made by molding injection and of transparent or translucent material.

Concerning the pins, a first pin 23 has a first contact electrically connected to the red chip 253 and a second contact extending downward and out of the base 12; a second pin 24 has a first contact electrically connected to the green chip 254 and a second contact extending downward and out of the base 12; a third pin 22 has, a first contact electrically connected to the blue chips 251 and 252 and a second contact extending downward and out of the base 12; and a common cathode pin 25 has a first contact electrically connected to the conductive plate 250 and a second contact extending downward and out of the base 12. Preferably, the pins 22, 23, 24 and 25 are angularly and equidistantly disposed on the base 12 and have a thickness of about 0.5 mm.

Figure 3:
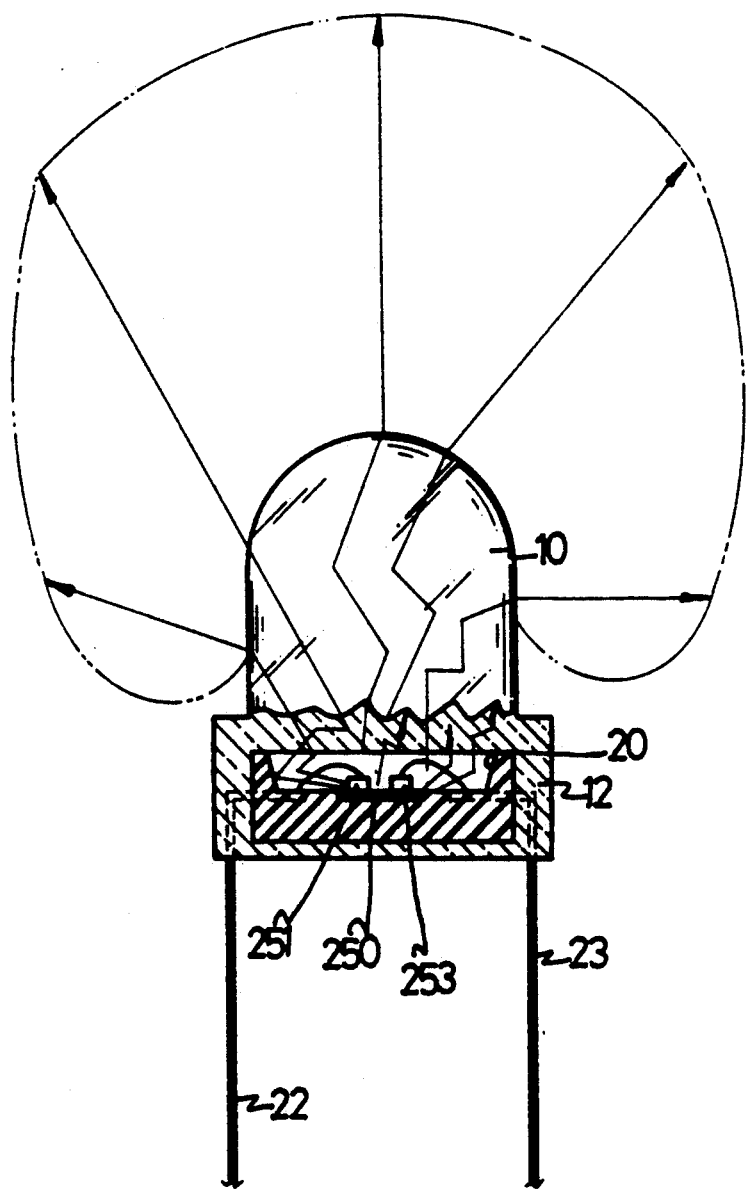
FIG. 3 is a view similar to FIG. 2, showing light emitting.

As known in colored light mixing, different intensities of light of the three primary colors emitted by the chips result in any desired colored light. Preferably, a bottom surface and a peripheral wall of the recess 12 are covered by a scattering agent, providing a complete mixing of light emitted by the chips. Thereafter, the resultant light is emitted through the housing 10 as shown in FIG. 3. Due to the provision of the invention, all visible light with a wavelength ranging from 470 nm to 700 nm may be obtained.

Although the invention has been explained in relation to its preferred embodiment, it is to be understood that many other possible modifications and variations can be made without departing the spirit and scope of the invention as hereinafter claimed.

I claim:

1. A light emitting diode comprising:
   a base having a reflective recess formed therein having a bottom surface and a peripheral wall, said bottom surface and said peripheral wall of said reflective recess being coated by a layer of scattering agent;
   a conductive plate in said reflective recess having a red chip, a green chip, and two blue chips disposed thereon;
   a housing disposed above said base for enclosing said chips;
   a first pin having a first contact electrically connected to said red chip and a second contact extending downward and out of said base;
   a second pin having a first contact electrically connected to said green chip and a second contact extending downward and out of said base;
   a third pin having a first contact electrically connected to said blue chips and a second contact extending downward and out of said base; and
   a common cathode pin having a first contact electrically connected to said conductive plate and a second contact extending downward and out of said base.

2. The light emitting diode as claimed in claim 1, wherein said pins are angularly and equidistantly disposed on said base.

* * * * *